(12) United States Patent
Li

(10) Patent No.: US 12,046,525 B2
(45) Date of Patent: Jul. 23, 2024

(54) SEMICONDUCTOR PACKAGING METHOD, SEMICONDUCTOR ASSEMBLY AND ELECTRONIC DEVICE COMPRISING SEMICONDUCTOR ASSEMBLY

(71) Applicant: Yibu Semiconductor Co., Ltd., Shanghai (CN)

(72) Inventor: Weiping Li, Shanghai (CN)

(73) Assignee: Yibu Semiconductor Co., Ltd., Shanghai (CN)

( * ) Notice: Subject to any disclaimer, the term of this patent is extended or adjusted under 35 U.S.C. 154(b) by 0 days.

(21) Appl. No.: 17/535,986

(22) Filed: Nov. 26, 2021

(65) Prior Publication Data

US 2022/0173005 A1 Jun. 2, 2022

(30) Foreign Application Priority Data

Nov. 27, 2020 (CN) .......................... 202011352624.1
Nov. 27, 2020 (CN) .......................... 202011353294.8

(51) Int. Cl.
*H01L 23/31* (2006.01)
*H01L 23/00* (2006.01)

(52) U.S. Cl.
CPC .......... *H01L 23/3128* (2013.01); *H01L 24/16* (2013.01); *H01L 2224/16221* (2013.01);
(Continued)

(58) Field of Classification Search
CPC ....... H01L 2224/95001; H01L 2224/19; H01L 2224/73204; H01L 2224/96;
(Continued)

(56) References Cited

U.S. PATENT DOCUMENTS 5,600,180 A 2/1997 Kusaka
6,809,421 B1 10/2004 Hayasaka
(Continued)

FOREIGN PATENT DOCUMENTS

CN 102194718 A 9/2011
CN 103890933 A 6/2014
(Continued)

OTHER PUBLICATIONS

Shanghai Yibu Semiconductor Co., Ltd., English Translation of KR First Office Action, KR 10-2022-0074762, Mar. 28, 2023, 7 pgs.
(Continued)

*Primary Examiner* — Victor A Mandala
*Assistant Examiner* — Lawrence C Tynes, Jr.
(74) *Attorney, Agent, or Firm* — USCH Law, PC

(57) ABSTRACT

A semiconductor packaging method, a semiconductor assembly and an electronic device comprising the semiconductor assembly are described herein. The semiconductor packaging method comprises providing at least one semiconductor device and a carrier board. A plurality of first alignment solder parts are formed on an active surface of each semiconductor device in addition to connection terminals. A plurality of second alignment solder parts are formed on a surface of the carrier board. The method further comprises forming a plurality of alignment solder joints by aligning and soldering the first alignment solder parts to respective ones of the second alignment solder parts whereby the semiconductor device is aligned and fixed to the carrier board; encapsulating the at least one semiconductor device to form a molded package body; sequentially forming a redistribution layer and external terminals on the molded package body so that the connection terminals are connected to the external terminal through the interconnection layer.

20 Claims, 8 Drawing Sheets

(52) U.S. Cl.
CPC ............... *H01L 2224/73204* (2013.01); *H01L 2924/15311* (2013.01); *H01L 2924/181* (2013.01)

(58) Field of Classification Search
CPC ..... H01L 2224/214; H01L 2224/80006; H01L 2224/81005; H01L 2224/82005; H01L 2224/83005; H01L 2224/84005; H01L 2224/85005; H01L 2224/86005; H01L 24/19; H01L 24/16; H01L 24/96; H01L 23/3128; H01L 2924/15311; H01L 2924/181; H01L 31/1892; H01L 21/4832; H01L 27/1266; H05K 2203/0156; H05K 3/4682; H05K 3/007; H01F 41/304
See application file for complete search history.

(56) References Cited

U.S. PATENT DOCUMENTS

| | | | |
|---|---|---|---|
| 10,847,435 | B2 | 11/2020 | Kim et al. |
| 2003/0062631 | A1 | 4/2003 | Nemoto |
| 2004/0100164 | A1* | 5/2004 | Murata ................ H03H 9/1085 310/348 |
| 2004/0113215 | A1* | 6/2004 | Shimada ................. H03H 3/08 257/E23.128 |
| 2004/0262368 | A1* | 12/2004 | Haw .................... B23K 1/0016 228/175 |
| 2004/0262774 | A1 | 12/2004 | Kang |
| 2006/0177965 | A1 | 8/2006 | Senda |
| 2007/0205520 | A1 | 9/2007 | Chou et al. |
| 2008/0284408 | A1 | 11/2008 | Kunst et al. |
| 2011/0074004 | A1 | 3/2011 | Shen |
| 2012/0032321 | A1* | 2/2012 | West ....................... H01L 24/81 257/737 |
| 2013/0059416 | A1 | 3/2013 | Liu et al. |
| 2013/0244382 | A1* | 9/2013 | Clark ..................... H01L 24/19 438/124 |
| 2013/0248237 | A1 | 9/2013 | Zhou |
| 2015/0255415 | A1* | 9/2015 | De Bonis ................ H01L 25/50 438/126 |
| 2017/0358554 | A1 | 12/2017 | Chen et al. |
| 2019/0103375 | A1* | 4/2019 | Huang .................... H01L 24/16 |
| 2020/0161183 | A1 | 5/2020 | Lai et al. |

FOREIGN PATENT DOCUMENTS

| | | |
|---|---|---|
| CN | 104037153 A | 9/2014 |
| CN | 102983087 B | 6/2015 |
| CN | 105244341 A | 1/2016 |
| CN | 105448862 A | 3/2016 |
| CN | 108028239 A | 5/2018 |
| CN | 109585312 A | 4/2019 |
| CN | 112018047 A | 12/2020 |
| JP | 06112463 A | 4/1994 |
| JP | 2004253598 A | 9/2004 |
| JP | 2007189066 A | 7/2007 |
| JP | 2008171879 A | 7/2008 |
| KR | 20140070602 A | 6/2014 |
| KR | 20170026170 A | 2/2019 |
| TW | M507066 U | 8/2015 |
| TW | 201921620 A | 6/2019 |

OTHER PUBLICATIONS

Shanghai Yibu Semiconductor Co., Ltd., KR First Office Action with English Translation, KR 10-2021-01640040, Mar. 29, 2023, 11 pgs.
Shanghai Yibu Semiconductor Co., Ltd., KR Second Office Action with English Translation, KR 10-2021-01640040, Nov. 26, 2023, 13 pgs.
Shanghai Yibu Semiconductor Co., Ltd., KR First Office Action with English Translation, KR 10-2021-0164048, Nov. 6, 2023, 11 pgs.
Wciping Li, U.S. Appl. No. 17/535,983, Non-Final Office Action issued Jun. 30, 2023.
Weiping Li, U.S. Appl. No. 17/568,293, Non-Final Office Action issued Jul. 17, 2023.
Weiping Li, U.S. Appl. No. 17/568,293, Final Office Action issued Dec. 20, 2023.

\* cited by examiner

SEMICONDUCTOR PACKAGING METHOD, SEMICONDUCTOR ASSEMBLY AND ELECTRONIC DEVICE COMPRISING SEMICONDUCTOR ASSEMBLY

CROSS REFERENCE TO RELATED APPLICATIONS

This application claims the benefit of priority under the Paris Convention to Chinese Patent Application No. CN202011352624.1, filed Nov. 27, 2020, entitled "Semiconductor Packaging Method, Semiconductor Assembly and Electronic Device Comprising Semiconductor Assembly," and Chinese Patent Application No. CN202011353294.8, filed Nov. 27, 2020, entitled "Semiconductor Packaging Method, Semiconductor Assembly and Electronic Device Comprising Semiconductor Assembly," each of which is incorporated by reference herein in its entirety. This application is related to U.S. patent application Ser. No. 17/535,983, entitled "Semiconductor Packaging Method, Semiconductor Assembly and Electronic Device Comprising Semiconductor Assembly," filed on even date herewith, which is incorporated by reference herein in its entirety.

FIELD OF THE INVENTION

The present application relates to the technical field of semiconductor manufacturing, in particular to a semiconductor packaging method, a semiconductor assembly and electronic device comprising the semiconductor assembly.

BACKGROUND

Semiconductor packages and systems that are compact, small, lightweight, and thin in design, while at the same time achieving high integration and versatility in function, are constantly being sought. Currently, various packaging technologies are proposed to meet the above-mentioned technical requirements, such as Fan-out (Fan-out) wafer level packaging, small chip packaging (chipset), heterogeneous integration (heterogenous integration), and 2.5-dimensional (2.5D) or three-dimensional (3D) packaging. These packaging techniques have different advantages and characteristics, but all present some technical challenges. Taking the existing fan-out package as an example, it faces many technical problems, such as warpage (warp), chip shift (die shift), surface flatness (topography), non-coplanarity between the chip and the molded package body (chip-to-mold non-planarity), package reliability (reliability), etc. Despite the continuing efforts in the industry to improve these technical problems by improving the equipment, materials, process elements, there is no economical and effective solution to some of the technical problems, especially problems such as warpage, chip drift, and surface coplanarity between different chips.

In addition, there are common techniques involved in the fabrication of various high-end semiconductor packages and systems, often involving the placement and attachment of semiconductor devices with high precision. This process step is usually performed by a high precision mounting (pick and place or die binder) equipment, which is very expensive. Still, the mounting speed is limited, resulting in low production speed, which becomes a bottleneck for the development and popularization of the technology.

Certain embodiments in the present application are directed to solving several of the core technical problems set forth above.

SUMMARY

Certain embodiments of the present application are directed to a novel and novel semiconductor packaging method, semiconductor device and electronic device including the semiconductor device, which at least solve the above and other problems of the prior art.

An aspect of the present application provides a semiconductor packaging method, including: providing a semiconductor device and a carrier board, wherein a plurality of first alignment solder parts are formed on the active surface of the semiconductor device besides a connecting terminal, and a plurality of second alignment solder parts respectively corresponding to the first alignment solder parts are formed on the carrier board.

The semiconductor package method further includes: placing the semiconductor device on the carrier board such that the plurality of first alignment solder parts are substantially aligned with the plurality of second alignment solder parts; forming a plurality of alignment solder joints by soldering the plurality of first alignment solder parts and the plurality of second alignment solder parts so that the semiconductor device is precisely aligned and fixed to the carrier board; and forming a molded package body for coating the semiconductor device by performing molded package body on the side of the carrier board where the semiconductor device is located.

The semiconductor package method further includes: exposing the connecting terminal from the molded package body after removing the carrier board; and sequentially forming an interconnection layer and an external terminal on a surface of the molded package body exposing the connection terminal such that the connection terminal is connected to the external terminal through the interconnection layer.

Another aspect of the present application provides a semiconductor device packaged by the above semiconductor packaging method.

Yet another aspect of the present application provides an electronic device including the semiconductor device described above.

It should be understood that the above description is only an overview of the present application so that the technical solutions of the present application can be more clearly understood and implemented according to the contents of the specification. In order to make the aforementioned and other objects, features and advantages of the present application more comprehensible, embodiments of the present application are described in detail below.

BRIEF DESCRIPTION OF THE DRAWINGS

The above and other objects, features and advantages of exemplary embodiments will become readily apparent from the following detailed description read in conjunction with the accompanying drawings. Several embodiments are illustrated by way of example, and not by way of limitation, in the figures of the accompanying drawings and in which the same or corresponding reference numerals indicate the same or corresponding parts.

DETAILED DESCRIPTION OF THE EMBODIMENTS

Figure 1:
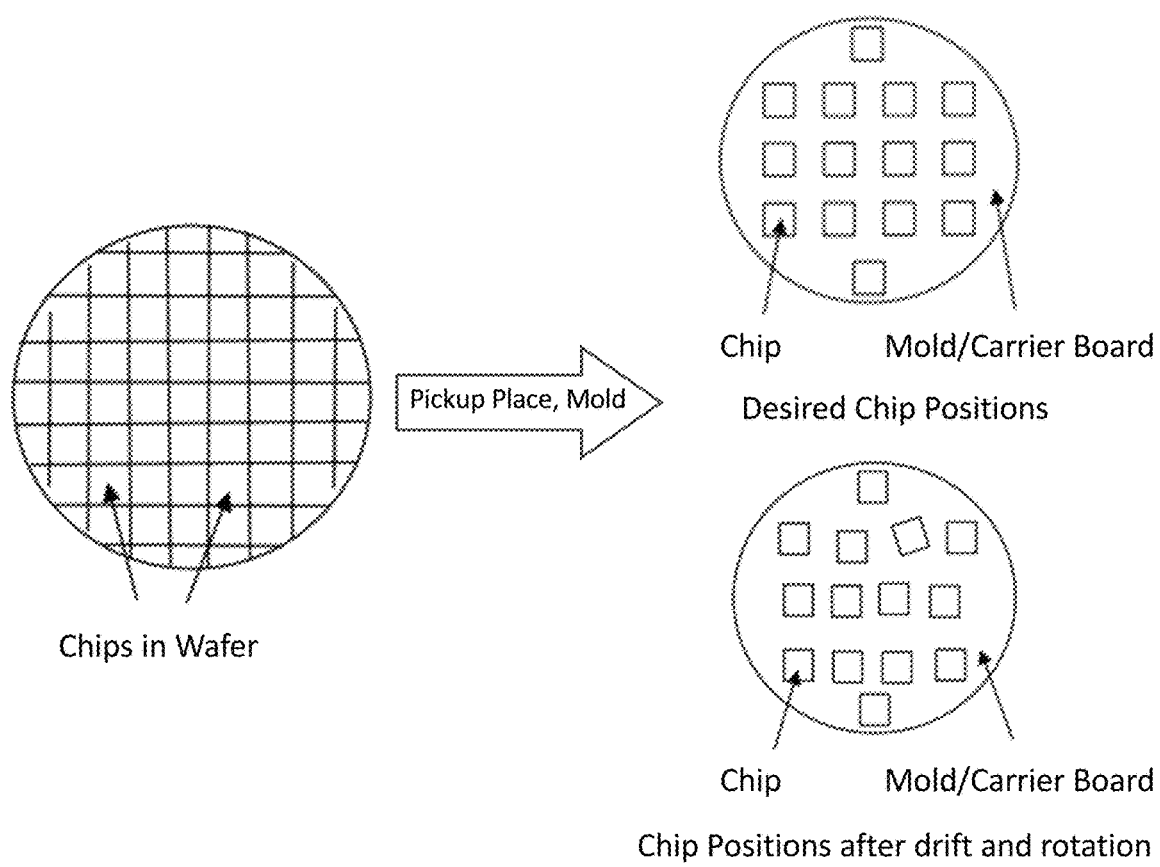
FIG. 1 is a schematic diagram illustrating a chip drift and a chip rotation phenomenon caused by a placement misalignment or a mold flow (mold flow) push during a chip-on-chip (chip-first) fan-out type package according to the related art.

The present application is intended in the following description to include at least one embodiment with reference to the accompanying drawings, in which like numerals represent the same or similar elements. Although the following description is based primarily on specific embodiments, it should be understood by those skilled in the art that the following description is intended to cover alternatives, modifications, and equivalents, which may be included within the spirit and scope of the present invention as defined by the appended claims and their equivalents, and as supported by the following description and drawings. In the following description, certain specific details are set forth, such as specific configurations, compositions, and processes, etc., in order to provide a thorough understanding of the present application. In other instances, well-known process and manufacturing techniques have not been described in detail in order to avoid unnecessarily obscuring the present application. Furthermore, the various embodiments shown in the figures are schematic representations and are not necessarily drawn to scale.

Semiconductor components (which may also be referred to as semiconductor packages) are a core component of modern electronic devices or products. Semiconductor components can be broadly classified in terms of device number and density into: discrete semiconductor devices, i.e., single chip devices, such as a single digital logic processor, diode, transistor; multi-chip components, such as a module of image sensors (CIS) and image processors (ASIC), a stack of a Central Processing Unit (CPU) and a dynamic memory (DRAM); and system level components, such as radio frequency Front End Modules (FEMs) in cell phones, display screen modules in cell phones and smart watches. Generally, the system-level package includes a large number of devices, including passive components (resistors, capacitors, inductors) and other devices or even components, in addition to semiconductor devices.

The semiconductor components herein may include active and passive devices including, but not limited to, active devices such as bipolar transistors, field effect transistors, integrated circuits, and passive devices such as chip resistors, capacitors, inductors, Integrated Passive Devices (IPDs), micro-electro-mechanical systems (MEMS), and the like. Various electrical connections are established between various active and passive devices to form circuits that enable the semiconductor assembly to perform high speed calculations and other useful functions.

Currently, semiconductor manufacturing typically involves two complex manufacturing processes, namely front-end wafer fabrication and back-end packaging, each of which may involve hundreds of steps. Previous wafer fabrication involves forming a plurality of chips (die) on the surface of the wafer. Each chip is generally identical and contains internally the circuits formed by the electrical connections of the active and/or passive elements. Subsequent packaging involves separating individual chips from the finished wafer and packaging them into semiconductor assemblies to provide electrical connections, structural support, heat dissipation, and environmental isolation, while facilitating subsequent assembly of the electronic product.

An important goal of semiconductor manufacturing is to produce smaller semiconductor devices, packages, and assemblies. Smaller sizes, generally higher integration, less power consumption, higher performance, and smaller area/volume, are important to the performance of the final product. In one aspect, wafer fabrication can be improved to shrink chip sizes, increase circuit density and/or improve performance. In another aspect, subsequent packaging can be improved to further reduce the sizes, increase the density and improve the performance of the semiconductor assembly by improving the packaging design, process and packaging material.

In the back-end packaging process, a novel and efficient packaging method is the so-called fan-out packaging. Fan-out packaging is a packaging technique that wraps single or multiple qualified chips (die) from a diced wafer with a molding compound and routes interconnect traces from the chip's interconnect pads to external solder balls via a redistribution layer (RDL) to achieve higher I/O density and flexible integration. The fan-out type package may be mainly classified into a chip-first type package and a chip-last type package. Chip-first type packages can be classified into a face-down type and a face-up type.

The chip-first/face-down type packaging mainstream process comprises the following main steps: picking up chips from the cut wafer and placing the chips on a carrier board pasted with an adhesive film so that an active surface of the chips faces the adhesive film; encapsulating the chips using a molding compound; removing the carrier board (together with the adhesive film) to expose the active surface of the chip; forming an interconnection layer (including an RDL layer and Under Bump Metallization (UBM)) on an active surface of a chip; forming solder balls on the interconnection layer, wherein the interconnection pads or the interconnection bumps of the chip are electrically connected with the solder balls through the interconnection layer; and dicing to form individual semiconductor elements.

The chip-first/face-up type packaging process and the chip-first/face-down type packaging process can be approximately the same, and the main difference is as follows: picking up a chip and placing the chip on a carrier board pasted with an adhesive film, wherein the active surface of the chip is opposite to (or facing away from) the adhesive film; thinning the molded package body on one side of the active surface of the chip after encapsulation to expose the interconnection bumps on the active surface of the chip; and the carrier board may be removed after the formation of the interconnect layer and the solder balls.

Figure 2:
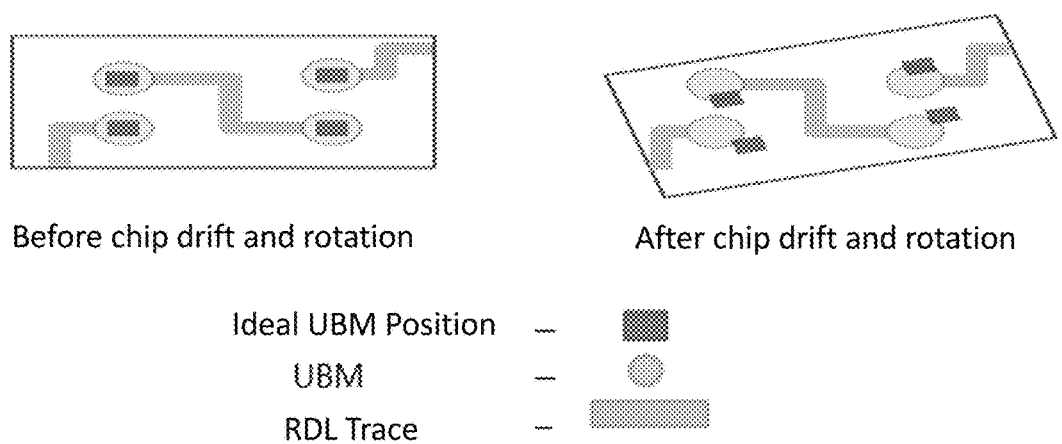
FIG. 2 shows a state diagram of Under Bump Metallization (UBM) and redistribution layer (RDL) trace position mismatch (or misalignment) formed after chip drift and rotation as shown in FIG. 1.

In the technical problem faced by the fan-out package at present, the high-precision placement and position fixing of the chip still lack an efficient and economical method. The higher the chip placement accuracy, the higher the equipment cost, the lower the production efficiency, and the more difficulty in breaking through the 0.5-micron limit of the chip mounting equipment. In addition, after a chip is placed on the adhesive film, which is used for bonding and fixing the chip, the flowing of the molding material can push the chip in the encapsulation process, so that the chip can be displaced and rotated on the adhesive film due to the deformability of the adhesive film. The higher temperatures used in the molding process further exacerbate this problem. Another source of chip displacement and rotation is internal stresses within the molded structure (the structure in which the chip and carrier are encapsulated d in a molding compound). Specifically, in the existing chip-first/face-down type packaging process, the encapsulation process comprises three stages: heating and injection molding, partial curing of a encapsulation material in high-temperature, and cooling, which are usually followed by a constant temperature heating step to fully cure the molding compound. The thermal expansion coefficients of the chip, the molding compound, the adhesive film, the carrier board, and the like are different, so the mismatch of the thermal expansion coefficients of various materials and the curing shrinkage of the molding compound in the encapsulation process cause uneven internal stress of the molding compound, which further causes chip drift and/or rotation (as shown in the chip arrangement at the lower right of FIG. 1) and warpage of the molded package body. Chip drift and/or rotation in turn causes positional mismatch or misalignment of subsequently formed RDL traces and UBMs (as shown in FIG. 2), which can result in a significant yield drop. The warpage of the molded package body causes difficulties in subsequent packaging processes including Under Bump Metallization (UBM) and redistribution line (RDL), and in severe cases even make it impossible to continue the process.

The present application aims to provide a novel and breakthrough packaging method that can at least solve the above technical problems.

A packaging method according to some embodiments utilizes self-alignment capability of alignment solder joints (joints) between a semiconductor device and a carrier board in a molten or partially molten state of solder to automatically and precisely align the semiconductor device to a target position on the carrier board and fix the position the semiconductor device after the solder is solidified In some embodiments, first alignment solder parts are pre-formed on an active surface (i.e. the front surface with interconnect terminals, which can be interconnect or contact pad, or interconnect or contact bumps) of the semiconductor device, and corresponding second alignment solder parts are formed on the carrier board. For example, one of a first alignment solder part and a corresponding second alignment solder part can be a solder bump, while the other of the first alignment solder part and the corresponding second alignment solder part can be a solder pad or solder bump In some embodiments, after placing the semiconductor device at the target position on the carrier board by aligning the first alignment solder parts and the second alignment solder parts with each other, one (or both) of each first alignment solder part and the corresponding second alignment solder part are melted to form an alignment solder joint. At this point, if the semiconductor device is not precisely aligned to the target position on the carrier board (i.e., the first alignment solder part and the corresponding second alignment solder part are not aligned), the alignment solder joint in a molten or partially molten (liquid or partially liquid) state should automatically and precisely guides the semiconductor device to the target position to achieve surface energy minimization according to the principle of minimum surface energy, and the fused alignment solder joint keeps the semiconductor device firmly fixed at the target position after solidification. The first and second alignment solder parts are optimally designed (in terms including but not limited to volume, geometry, composition, location, distribution, and number, etc.) to enable the most accurate, efficient, and reliable self-alignment capability. Fixing the semiconductor device on the carrier board by adopting the soldering technique instead of the adhesive film bonding technique leads to many advantages. For example, the warping problem is improved, the possible drifting and rotating problems of the semiconductor device in the encapsulation process are prevented by the firm soldering joints, the placing deviation of a certain degree can be allowed when the semiconductor device is picked up and placed in view of the self-aligning capacity of the alignment solder joint, the requirement on the placing precision of the semiconductor device (especially for chip and place or die bonder) can be obviously reduced, the picking and placing operation speed of the semiconductor device can be obviously improved, the process efficiency is improved, and the process cost is reduced.

As used herein, the term "semiconductor device" may refer to a chip (also interchangeably referred to as die, integrated circuit) produced by a chip factory (fab), i.e., a chip that has not been packaged after wafer dicing and testing, and which may typically have only interconnect pads (pads) for external connection. The semiconductor device may also be a pre-processed (at least partially packaged) chip, such as with interconnect bumps (bump) formed on the interconnect pads, or may have additional structures, such as stacked chips and packaged chips, as desired.

The term "active surface" as used herein generally refers to a surface on a front side of a semiconductor device having a circuit function, including interconnect pads (or interconnect bumps formed on the interconnect pads) thereon, and may also be interchangeably referred to as a front surface or a functional surface. A surface having no circuit function on an opposing back side of the semiconductor device may be interchangeably referred to as a passive surface or a back surface.

The term "connection terminal" as used herein generally refers to an interconnect pad or an interconnect bump on the active surface of a semiconductor device.

The term "alignment solder part" as used herein generally refers to a structure that may be aligned and soldered to a corresponding other alignment solder part for alignment by soldering methods known in the art.

Figure 3:
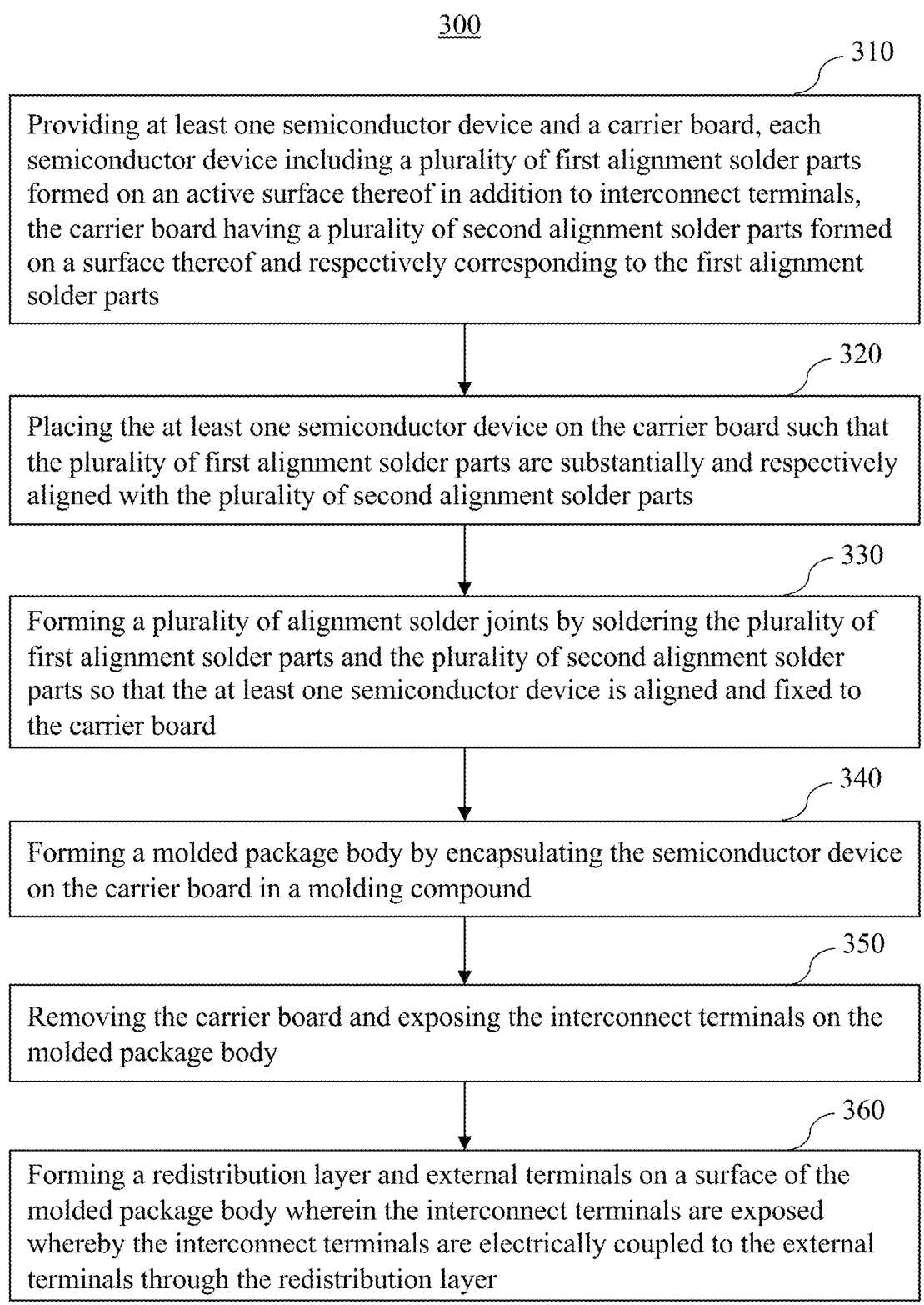
FIG. 3 shows a flow chart of a packaging method according to an embodiment of the application.

FIG. 3 shows a schematic flow diagram of a packaging method according to an embodiment of the present application. As shown in FIG. 3, the packaging method includes the following steps:

s310: providing at least one semiconductor device and a carrier board In some embodiments, a plurality of first alignment solder parts are formed on the active surface of the semiconductor device besides the connecting terminals, and a plurality of second alignment solder parts respectively corresponding to the first alignment solder parts are formed on the carrier board.

In some embodiments, the at least one semiconductor device includes a plurality of semiconductor devices. As an example, the plurality of semiconductor devices may be at least partially different from each other in function, size, or shape, or may be the same as each other. It should be understood that the type and specific number of the semiconductor devices may be appropriately selected according to specific process conditions or actual requirements (for example, the size and shape of the carrier board and the semiconductor devices, the placement pitch or package size and shape of the semiconductor devices, manufacturing process specifications, functional design of semiconductor assemblies, etc.), and the present application is not particularly limited thereto.

In some embodiments, the carrier board or carrier is a glass carrier, a ceramic carrier, a metal carrier, an organic polymer material carrier, or a silicon wafer, or a combination of two or more of the above carriers.

In some embodiments, either one of the first and second alignment solder parts is an alignment solder bump and the other is an alignment pad corresponding to the alignment solder bump. In other embodiments, the first alignment solder part and the second alignment solder part are both alignment solder bumps, and the melting points of the first alignment solder part and the second alignment solder part can be the same or different. As an example, the alignment solder bumps may be pre-fabricated on a semiconductor device (e.g., a wafer) or a carrier using a bumping process (e.g., electroplating, ball-planting, stencil printing, evaporation/sputtering, etc.) known in the art. As an example, the alignment pad may be fabricated on the semiconductor device or the carrier board in advance using a deposition (e.g., metal layer)-photolithography-etching process. It should be understood that any other weld configuration or form may be used as long as the first and second alignment welds are capable of being welded to each other for alignment purposes.

In some embodiments, the first alignment solder and the second alignment solder correspond to each other in volume, size, geometry, composition, distribution, location, and number, so that the semiconductor devices can be precisely aligned to the respective target positions on the carrier board by soldering to each other.

It should be understood that the specific volume, size, geometry, composition, distribution, location and number of the first alignment solder part and/or the second alignment solder part may be appropriately selected according to specific process conditions or actual requirements (for example, the size and shape of the carrier board and the semiconductor device, the placement pitch or package size and shape of the semiconductor device, etc.), and the present application is not particularly limited thereto. For example, the first alignment solder parts may be formed in substantially the same volume, size, geometry, or composition for all semiconductor devices regardless of whether functions, sizes or shapes are identical to each other, and the second alignment solder parts on the carrier board may be formed in substantially the same volume, size, geometry, or composition, so as to reduce the complexity of subsequent processes and improve the packaging efficiency. For another example, for semiconductor devices with different functions, sizes, or shapes, the first alignment solder part and the second alignment solder part may be formed with different volumes, sizes, geometries or compositions so that different bond pad heights may be formed after subsequent bonding to achieve a particular function or to meet a particular requirement. In some embodiments, for a plurality of semiconductor devices, the first alignment solder part and/or the second alignment solder part are configured to enable active surfaces of the plurality of semiconductor devices to lie in a same plane parallel to a surface of the carrier board after subsequent formation of alignment bonds or joints. In some embodiments, for a plurality of semiconductor devices, the first alignment solder part and/or the second alignment solder part are configured to enable passive surfaces of the plurality of semiconductor devices to lie in a same plane parallel to the carrier board after subsequent formation of alignment solder parts. For another example, at least three first alignment solder parts distributed substantially regularly may be formed on each of the semiconductor devices, so that the active surface of the semiconductor device can be firmly and stably maintained in a plane substantially parallel to the carrier board by the bonding of the first alignment solder parts and the second alignment solder parts. For another example, the first alignment solder part may be formed on an edge of each of the semiconductor devices, which is sufficiently far from the connection terminals, so as not to affect subsequent processes and product applications.

Figure 4A:
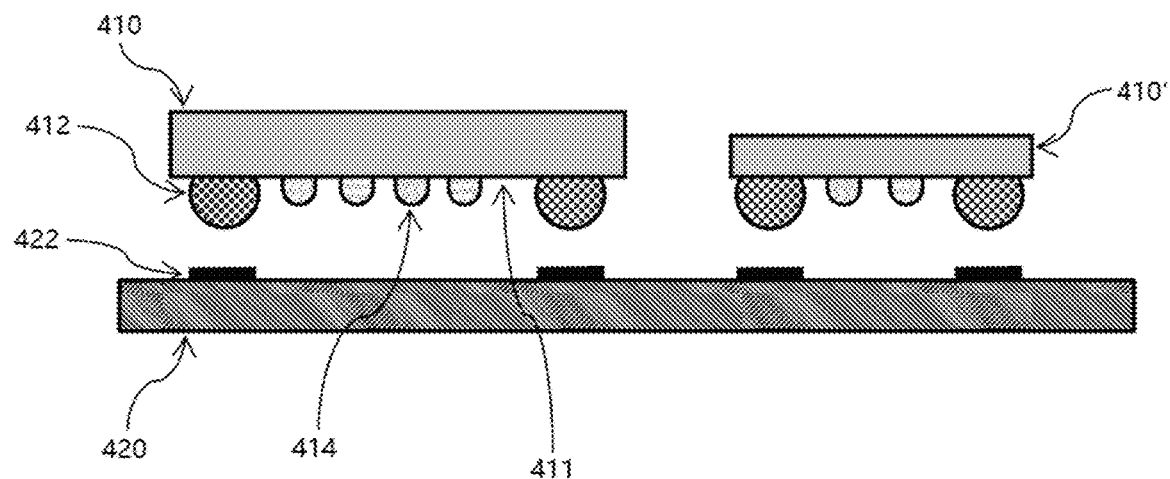
FIG. 4A to 4G show cross-sectional views for schematically illustrating a packaging method according to an exemplary embodiment of the present application.

In some embodiments, the connection terminals are interconnect bumps 414, as shown in FIG. 4A. By way of example, the interconnect bumps 414 may be pre-formed on interconnect pads on the semiconductor device using a bumping process known in the art (e.g., electroplating, ball-planting, stencil printing, evaporation/sputtering, etc.). For example, an interconnect bump 414 may be in the form of a conductive pillar. As a specific embodiment, in a direction perpendicular to an active surface of the semiconductor device (or a carrier board), a height of the interconnection bump is sufficiently smaller than a sum of the heights of the first alignment solder part and the second alignment solder part, so that a height of an alignment solder joint formed after subsequent bonding of the first alignment solder part and the second alignment solder part is larger than a height of the interconnection bump 414, so as not to affect subsequent bonding of the first alignment solder part and the second alignment solder part, or so as not to be damaged by being pressed against the carrier board at the time of subsequent bonding of the first alignment solder part and the second alignment solder part.

Figure 5A:
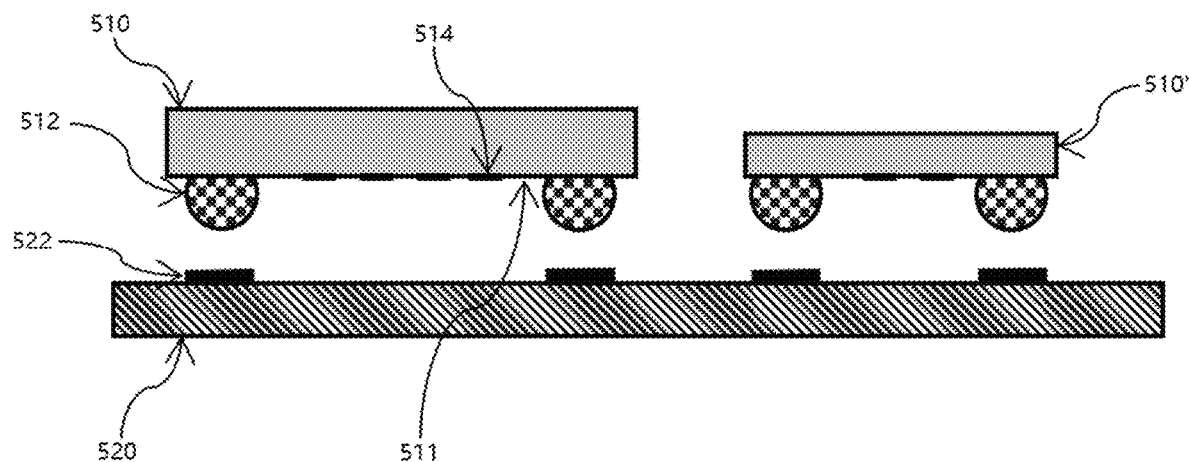
FIG. 5A to 5G show cross-sectional views for schematically illustrating a packaging method according to another exemplary embodiment of the present application.

In an alternative embodiment, the connection terminal is the interconnect pad itself, as shown in FIG. 5A.

S320: placing the at least one semiconductor device on the carrier board such that the plurality of first alignment solder parts are substantially aligned with the plurality of second alignment solder parts.

In some embodiments, the "substantial alignment" includes the first alignment solder part and the second alignment solder part contacting each other, respectively, without being precisely centered in a direction perpendicular to the passive surface. Here, "centered" is generally meant that the centers of the first and second alignment welds are aligned in a direction perpendicular to the active or passive surface. It should be noted that "substantial alignment" of the first alignment solder part with the second alignment solder part means that there is at least contact between the first alignment solder part and the second alignment solder part to the extent that self-alignment is possible by virtue of the principle of minimum surface energy of the alignment solder part in a molten or partially molten state during welding, as described below, and thus "substantial alignment" includes a state of imprecise alignment but at least physical contact, but may not exclude a state of exact alignment.

It should be understood that, when the semiconductor device is placed on the carrier board in step S320, the active surface of the semiconductor device faces the carrier board (i.e., the surface on which the first alignment solder part is formed), and the passive surface of the semiconductor device faces away from the carrier board.

S330: forming a plurality of alignment solder joints by soldering the plurality of first alignment solder parts and the plurality of second alignment solder parts so that the at least one semiconductor device is precisely aligned and fixed to the carrier board.

It should be noted that "precise alignment" indicates a state where a deviation between an actual position and a target position of the semiconductor device on the carrier board is within a preset tolerance in the art. It should be understood that the precise alignment is achieved using the principle of minimum surface energy exhibited by the solder joint or bonds formed by soldering the first and second alignment solder parts in a molten or partially molten state during soldering. In particular, when the first alignment solder part and the second alignment solder part are in contact with each other but are not precisely centered in a direction perpendicular to the active surface of the semiconductor device or the carrier board, in the soldering process, one of the first alignment solder part and the second alignment solder part which is used as an alignment solder bump is melted or partially melted and wets the other one which is used as an alignment solder pad or another alignment solder bump, or both the first and second alignment solder parts melt or partially melt as alignment solder part bumps, thereby forming an alignment solder part in a molten or partially molten state In some embodiments, the alignment solder part in the molten or partially molten state tends to move in a deformation based on a minimum surface energy principle to bring the first alignment solder part and the second alignment solder part closer to a centered state, thereby driving the semiconductor device which is lighter relative to the carrier board to be accurately aligned to the target position on the carrier board.

It should be understood that after the first alignment solder part and the second alignment solder part are bonded for form a solder joint, the active surface of the semiconductor device and the carrier board are spaced apart to form a certain space therebetween due to the height of the alignment solder joint itself (in a direction perpendicular to the active surface of the semiconductor device or the carrier board) formed thereby.

In some embodiments, the alignment solder bump is made of solder, and the soldering may be performed by various means known in the art for melting solder, including but not limited to reflow soldering, laser soldering, high frequency soldering, infrared soldering, and the like.

In some embodiments, after S330, S331 is further included: in which the semiconductor device and the carrier board are turned over as a whole so that the carrier board is now above the at least one semiconductor device, and the alignment solder joint is cooled after melting or partially melting the alignment solder joint again to solidify the alignment solder joint. It will be appreciated that the alignment solder joints, which are re-melted or partially melted at this time, are moderately elongated by the weight of the semiconductor device, whereby the self-alignment accuracy can be further improved. It should be noted that the semiconductor device will not fall off the carrier board due to its own weight because of the surface energy of the alignment solder in the molten state or the partially molten state. As an alternative embodiment, in S310, viscous flux is pre-coated on the plurality of first and/or second alignment solders, and S330 includes S330': before the soldering is performed, the semiconductor device and the carrier board are turned over as a whole so that the carrier board is above the at least one semiconductor device. It should be appreciated that the alignment solder joints, which are melted or partially melted during soldering, are moderately elongated by the weight of the semiconductor device after being flipped at this time, whereby the self-alignment accuracy can be further improved. It should be noted that, since the viscous flux adheres the semiconductor device to the carrier, the semiconductor device would not fall off from the carrier due to its own weight after being turned over. It should be understood that before S340 described below, the semiconductor device and the carrier board as a whole need to be flipped again.

In some embodiments, when the semiconductor device includes a plurality of semiconductor devices, S330 includes S330": in which flattening processing is carried out on the passive surfaces of the semiconductor devices by utilizing a flattening plate, when the semiconductor devices are precisely aligned with the carrier board and the alignment solder joints are still in a molten or partially molten state, so that the passive surfaces of the semiconductor devices are leveled with respect to each other to be basically positioned in a same plane parallel to the carrier board. As an example, S330" includes: placing the platen over the passive surfaces of the plurality of semiconductor devices; pressing the platen toward the carrier board such that the passive surfaces of the plurality of semiconductor devices lie substantially in a same plane parallel to the carrier board; while maintaining the pressing, cooling to substantially solidify the alignment weld; and removing the platen. As an alternative embodiment, when the semiconductor device is plural, after S330, S332 is further included: in which, after the alignment solder joints are melted or partially melted again, the passive surfaces of the plurality of semiconductor devices are flattened by using a flattening plate so that the passive surfaces of the plurality of semiconductor devices are basically positioned in a same plane parallel to the carrier board. As an example, step S332 includes: melting or partially melting the alignment solder joints again; placing the platen over the passive surfaces of the plurality of semiconductor devices; pressing the platen toward the carrier board such that the passive surfaces of the plurality of semiconductor devices lie substantially in a same plane parallel to the carrier board; while maintaining the pressing, cooling to substantially solidify the alignment weld; and removing the platen. It will be appreciated that since the platen is not removed until the alignment solder joint has substantially solidified, the surface energy of the molten pad is prevented from restoring the semiconductor device to its original height prior to the platen.

Thus, the passive surfaces of all semiconductor devices can be precisely flush and at the same height. It will be appreciated that a suitable pressure needs to be applied to the platen such that the alignment solder joints in the molten or partially molten state are suitably deformed and the resulting vertical (with respect to the active surface of the semiconductor device or the carrier board) displacement of the platen is suitable to prevent damage to the semiconductor device. As an example, a solder trap (solder trap) is formed in advance around the second alignment solder part of the carrier board, thereby preventing uncontrolled random flow of excess molten solder during the pressing process.

In some embodiments, the flattening process using a flattening plate described above is combined with the solder process or the remelting process after the inversion described above. As an example, S330 is performed after S330' is performed in S330, or S332 is performed after S330 including S330' is performed, or S331 is performed after S330 including S330" is performed, or S332 is performed when S331 is performed.

S340: forming a molded package body for encapsulating the semiconductor devices on the side of the carrier board where the semiconductor device is disposed in a molding compound.

It should be understood that by the encapsulation not only the passive surface (i.e. the opposite surface of the active surface) and the side surfaces of the semiconductor device are encapsulated, but also the space between the active surface of the semiconductor device and the carrier board is filled with the molding compound.

In some embodiments, the molding encapsulation is performed using a molding compound of a resinous material (e.g., epoxy).

In some embodiments, the molding is performed using a molding process such as injection molding, printing, and optionally in combination with an underfill process.

S350: after the carrier board is removed, the connecting terminal is exposed from the molded package body.

In some embodiments, the carrier board is removed by lift-off, etching, ablation, grinding, and the like, as known in the art. As an example, when a lift-off process is used, the solder between the carrier board and the semiconductor device (i.e. the alignment solder joints) may be de-soldered to facilitate the lift-off of the carrier board from the molded package body.

In some embodiments, some or all of the alignment solder joints are also removed while or after the carrier board is removed. By way of example, some or all of the alignment solder joints may be removed by de-soldering, etching, ablating, or grinding, among other processes known in the art. In some embodiments, portions or all of the alignment solder joints are left as part of the final semiconductor assembly (i.e., the finished package) for electrical connections (e.g., power and ground), heat sinking, mechanical structures, etc.

In some embodiments, when the connection terminals are interconnect bumps, the interconnect bumps are exposed by thinning (e.g., grinding, etching, or ablating, etc.) the molded package body after removing the carrier board.

In some embodiments, when the connection terminal is an interconnection pad, the interconnection pad is exposed by forming an opening on the molded package body after removing the carrier board. By way of example, the openings may be formed using laser ablation (e.g., laser drilling). By way of example, the openings may be formed by mechanical drilling. As an example, prior to forming the opening, the molded package body may be thinned to meet product design requirements and/or to facilitate the opening.

S360: sequentially forming a redistribution layer and external terminals on a surface of the molded package body wherein the interconnect terminals are exposed whereby the interconnect terminals are electrically coupled to the external terminals through the redistribution layer.

In some embodiments, the interconnection layer includes a redistribution layer (RDL) and an Under Bump Metallization (UBM) in this order in a direction away from the connection terminal, thereby achieving conductive connection of the connection terminal with the external terminal. It should be understood that the interconnect layer further includes an insulating layer for achieving electrical insulation between the conductive paths, and the specific number and material of the insulating layer may be appropriately selected according to specific process conditions or needs, which is not particularly limited in the present application.

In some embodiments, the external terminals are solder balls.

In some embodiments, the external terminal is a pad.

In some embodiments, the packaging method further comprises: the side of the encapsulation body where the passive surface of the semiconductor device is located is thinned (e.g. ground, etched or ablated, etc.). As an example, it may be thinned to the passive surface of the semiconductor device, or the thinned portion comprises a portion of the passive surface side of the semiconductor device. This can further reduce the thickness of the final semiconductor module.

In some embodiments, passive devices are also packaged with the semiconductor device in substantially the same manner as the embodiments described above.

In some embodiments, the packaging method further comprises, after S360: and (6) cutting.

It should be understood that the dicing process may be performed to fabricate individual semiconductor devices or not performed according to the packaging specifications of the semiconductor devices, including but not limited to wafer level packaging, chip level packaging, system level packaging.

Hereinafter, the packaging method according to the present application will be described in more detail with reference to exemplary embodiments.

FIG. 4A to 4G show cross-sectional views for schematically illustrating a packaging method according to an exemplary embodiment of the present application.

As shown in FIG. 4A, a plurality of semiconductor devices and a carrier board 420 are provided. At least two of the semiconductor devices 410, 410' are different, e.g., different in size and/or function, among the plurality of semiconductor devices. On the active surface 411 of each semiconductor device 410, 410', a plurality of interconnection bumps 414 conductively connected to interconnection pads (not shown), respectively, are distributed and formed in regions other than the edges, and a plurality of alignment solder bumps 412 are formed spaced apart from the interconnection bumps 414 at the edges. For example, the active surface 411 of the semiconductor device 410, 410' is generally rectangular, and alignment solder bumps 412 that are substantially identical to each other may be formed near the four corners of the rectangle, respectively. The height of the alignment solder bump 412 in the direction perpendicular to the active surface 411 is greater than the interconnect bump 414. A plurality of alignment pads 422 are formed on a surface of the carrier board 420 in the same arrangement (or relative position) as the alignment bumps 412 on the semiconductor devices 410 and 410'. Alternatively, passive devices may be provided in a similar structure in addition to semiconductor devices. For example, reference numeral 410' as shown in FIG. 4 may be replaced with a passive device.

Figure 4B:
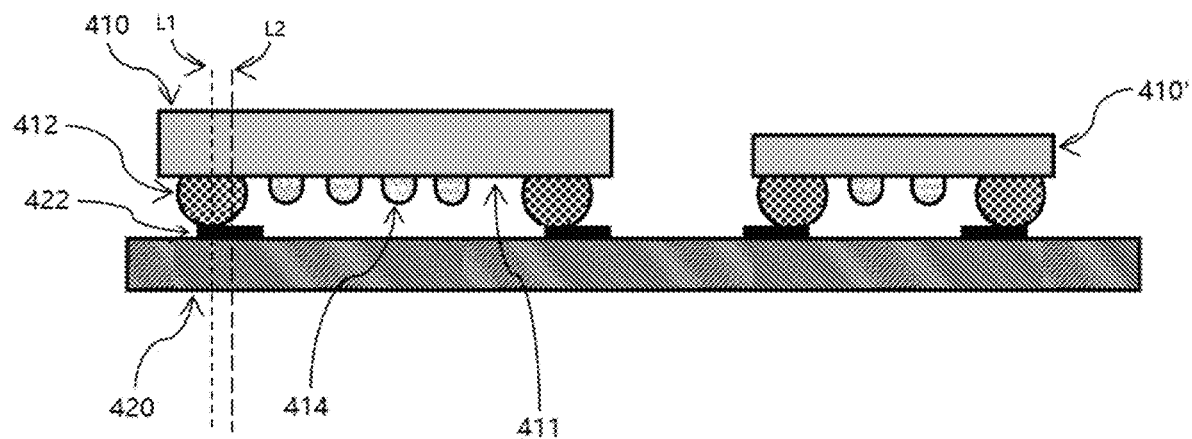

As shown in FIG. 4B, the semiconductor devices 410, 410' are placed on the carrier board 420 such that the alignment solder bumps 412 are in contact with the corresponding alignment pads 422. At this point, alignment solder bump 412 is misaligned with alignment pad 422 (i.e., the vertical centerline L1 of alignment solder bump 412 and the vertical centerline L2 of alignment pad 422 are not coincident).

Figure 4C:
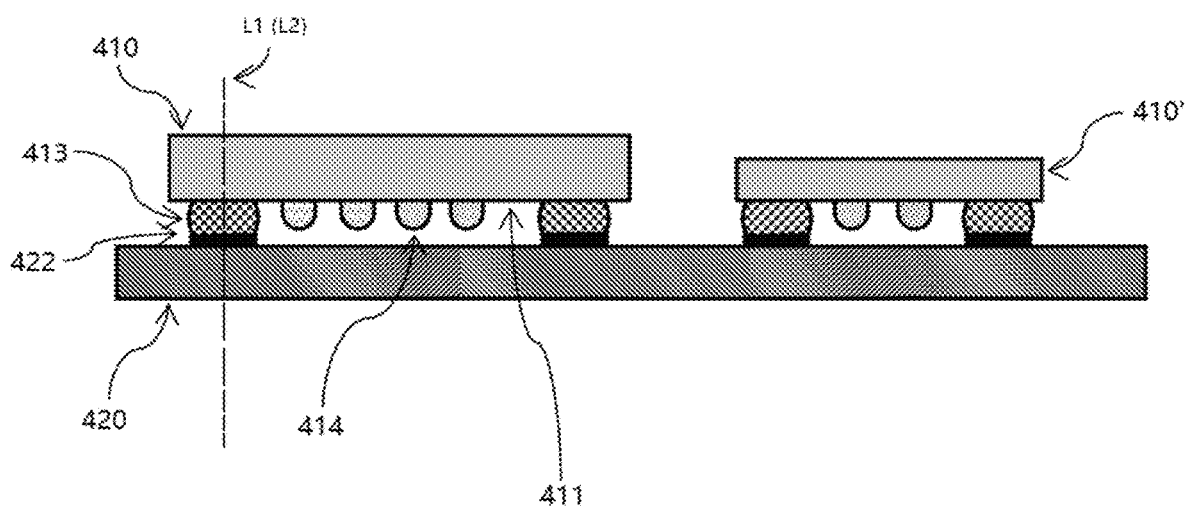

As shown in FIG. 4C, alignment solder bump 412 and alignment pad 422 are soldered (e.g., by reflow) to form alignment solder 413. During the soldering process, the alignment solder bump 412 in a molten state wets the alignment pad and self-aligns with the alignment pad 422 based on its minimum surface energy principle (i.e., the vertical center line L1 of the alignment solder bump 412 and the vertical center line L2 of the alignment pad 422 coincide), so that the semiconductor device 410, 410' is brought into precise alignment on the carrier board 420. After the soldering is completed, the active surface 411 of the semiconductor device 410, 410' (and the interconnect bumps 414) are spaced apart from the carrier board 420 to form a space.

Figure 4D:
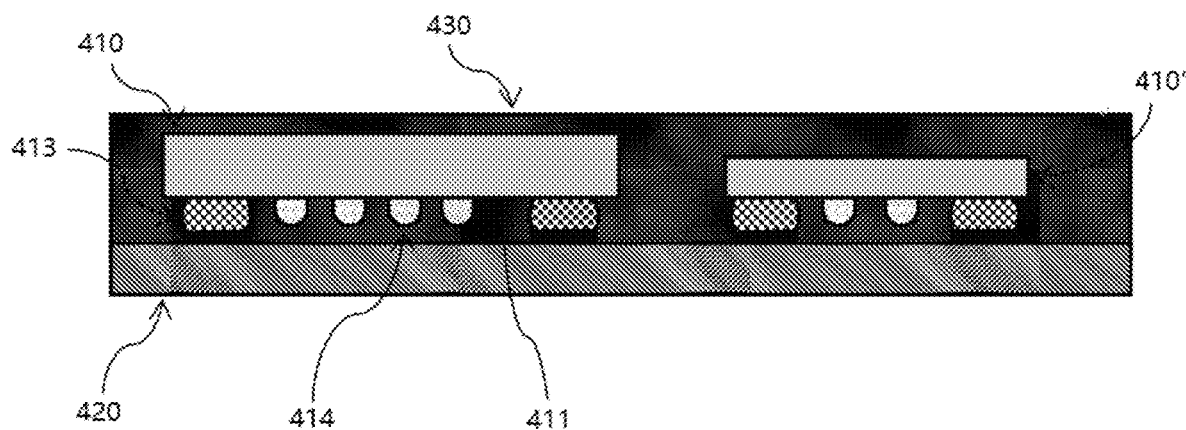

As shown in FIG. 4D, the carrier board 420 is molded on the side where the semiconductor devices 410 and 410' are bonded. The molding compound 430 encapsulates all surfaces of the semiconductor devices 410, 410', including the active surface 411 (and the interconnect bumps 414), the passive surface, and the side surfaces. The space below the active surface 411 may employ an underfill (underfill) process.

Figure 4E:
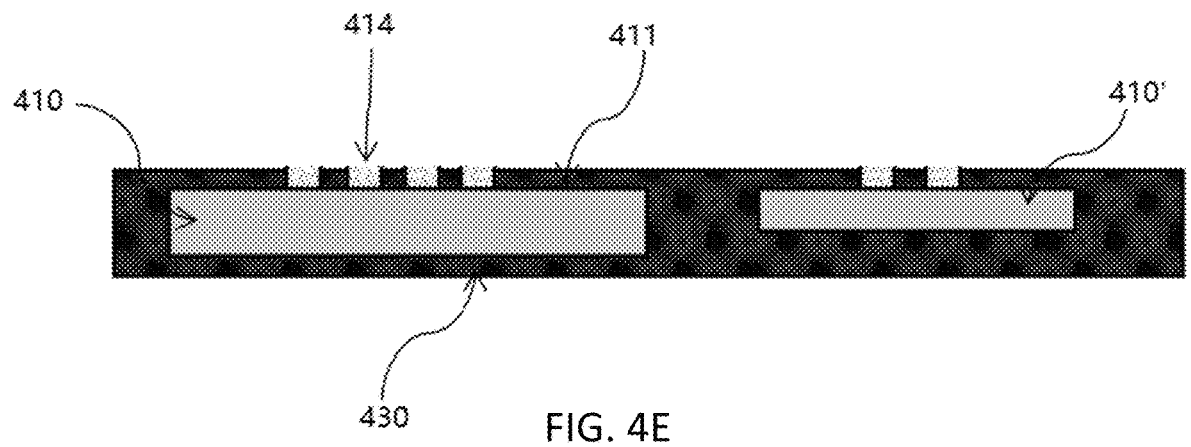

As shown in FIG. 4E, the carrier 420 is removed from the molded package body 430 and the molded package body 430 is then turned upside down. When the carrier 420 is removed, at least a portion of the alignment solder joints 413 (including the alignment pads 422) may also be removed at the same time. After the global flipping, the side of the molded package body 430 where the active surface 411 (or the interconnect bump 414) is located is thinned until the interconnect bump 414 is exposed. It is appreciated that at least a portion of the remaining alignment solder joints 413 may be further removed by thinning.

Figure 4F:
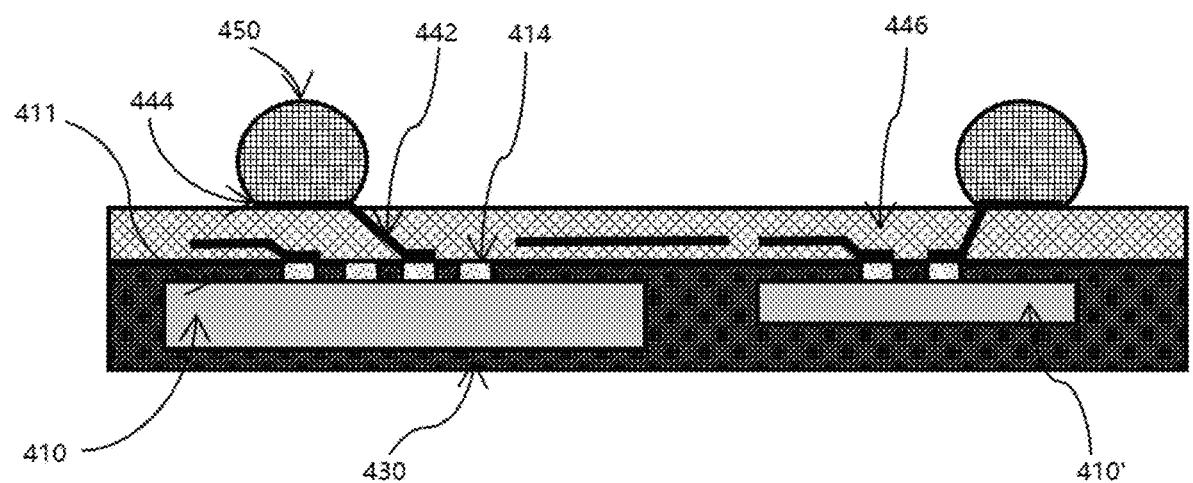

As shown in FIG. 4F, a redistribution layer (RDL) trace 442, a UBM 444, and solder balls 450 are sequentially formed on the surface of the molded package body 430 where the interconnect bump 414 is exposed, so as to form a conductive path from the interconnect bump 414 to the corresponding solder ball 450. In this process, a dielectric layer 446 is also formed to electrically insulate between the conductive paths, particularly when forming RDL traces 442 and/or UBM 444.

Figure 4G:
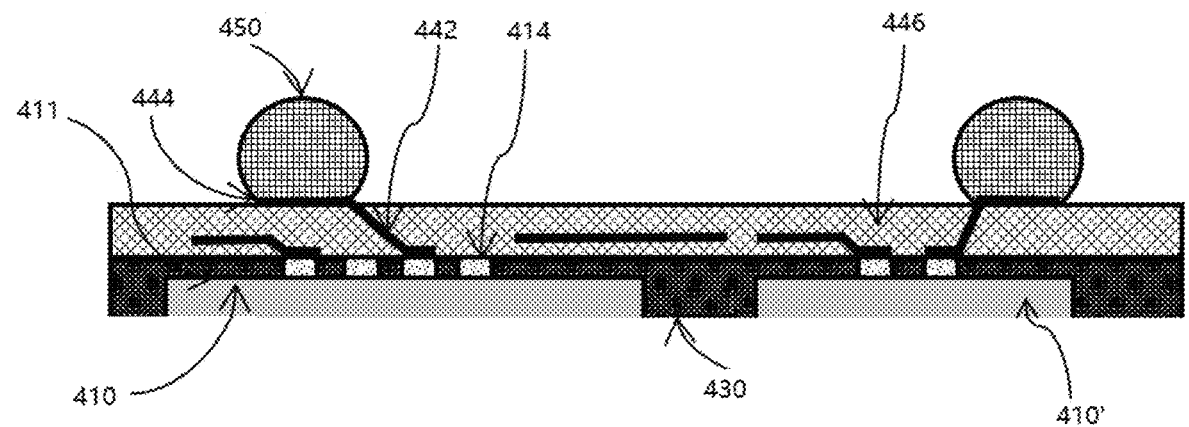

As shown in FIG. 4G, the other surface of the molded package body 430 (i.e., the side where the passive surface of the semiconductor device 410, 410' is located) is thinned to remove a portion of the passive surface side of the semiconductor device 410, 410'.

It should be understood that other processing (e.g., additional processing required for heterogeneous integrated packaging) may be further performed before, during, or after the steps of the packaging method described above, depending on the actual packaging needs.

Finally, although not shown, dicing (singulation) may be performed according to the packaging specifications of the semiconductor device to complete the fabrication of the individual semiconductor devices.

FIG. 5A to 5G show cross-sectional views for schematically illustrating a packaging method according to another exemplary embodiment of the present application. It is to be noted that the same or similar parts as those of the foregoing exemplary embodiment according to FIG. 4A to 4G will not be described again hereinafter.

As shown in FIG. 5A, a plurality of semiconductor devices and a carrier board 520 are provided. A plurality of interconnect pads 514 are distributed on the active surface 511 of each semiconductor device 510, 510' in areas other than the edges, and a plurality of alignment solder bumps 512 are formed spaced apart from the interconnect pads 514 at the edges. A plurality of alignment pads 522 are formed on a surface of the carrier 520.

Figure 5B:
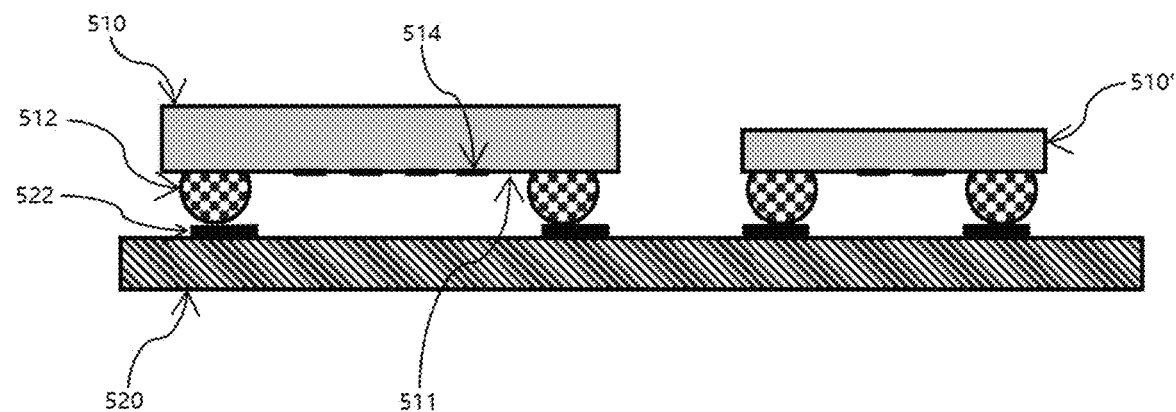

As shown in FIG. 5B, the semiconductor devices 510, 510' are placed on the carrier board 520 such that the alignment solder bumps 512 are in contact with the corresponding alignment pads 522. At this point, the alignment solder bump 512 is not aligned with the alignment pad 522.

Figure 5C:
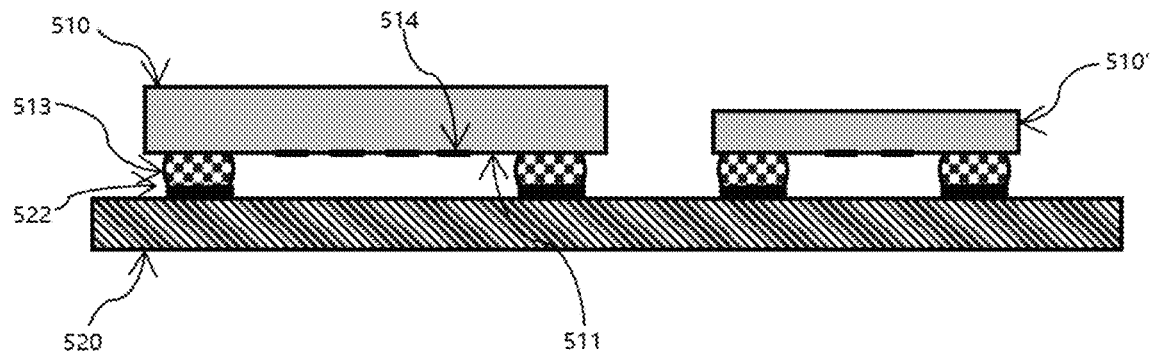

As shown in FIG. 5C, the alignment solder bumps 512 and the bonding pads 520 are bonded to form alignment solder joints 513, thereby achieving precise alignment of the semiconductor devices 510, 510' on the carrier board 520 based on the principle of minimum surface energy.

Figure 5D:
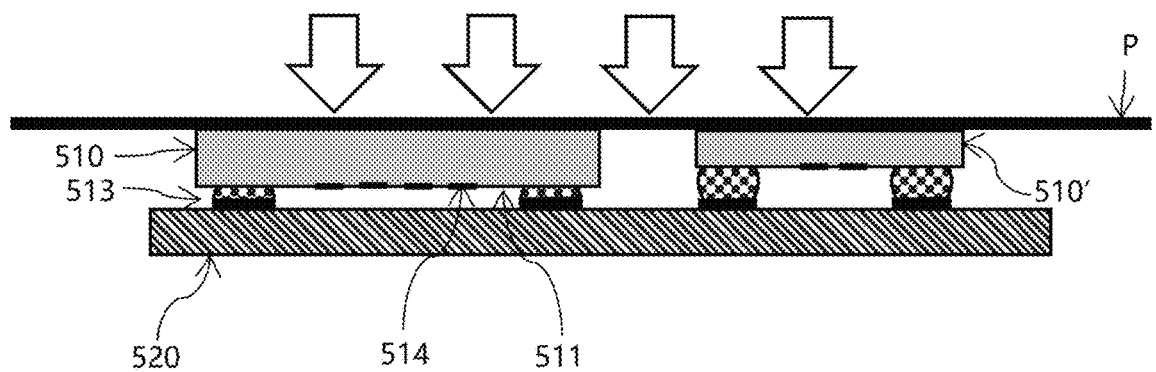

As shown in FIG. 5D, after the pressing plate P is placed on the passive surface (i.e., the opposite surface of the active surface 511) of the semiconductor devices 510, 510' while the solder joints 513 are still in a molten state, the pressing plate P is pressed (i.e., toward the carrier board 520) to perform a pressing process such that the passive surfaces of the plurality of semiconductor devices 510, 510' are in the same plane parallel to the carrier board 520. Subsequently, a temperature decrease is performed while keeping the pressing to solidify the alignment solder joints 513, and then the platen P is removed.

Figure 5E:
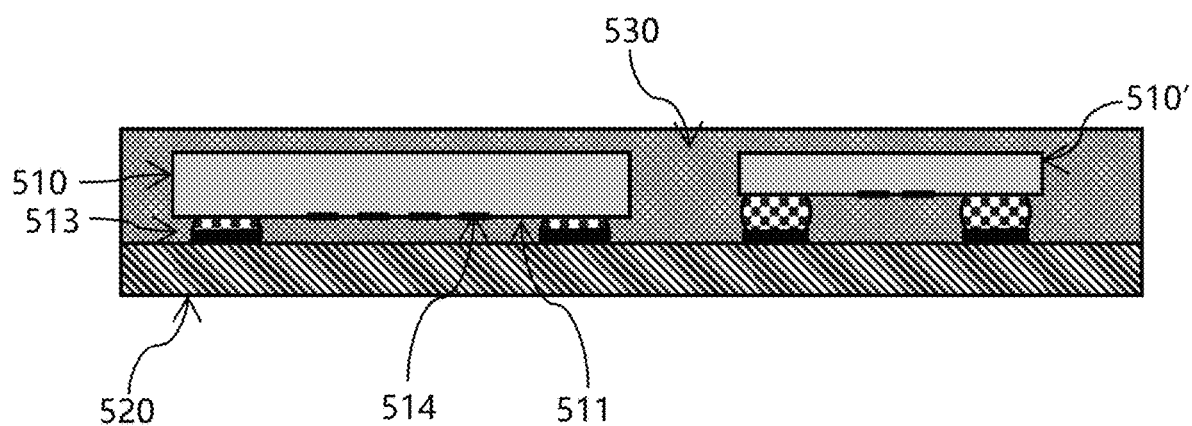

As shown in FIG. 5E, the carrier board 520 is molded on the side where the semiconductor devices 510, 510' are placed. The molding compound 530 encapsulates all surfaces of the semiconductor devices 510, 510'.

Figure 5F:
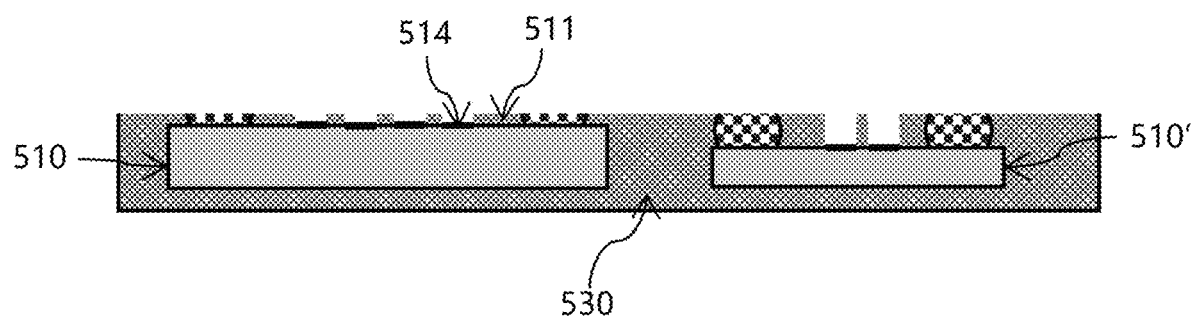

As shown in FIG. 5F, the carrier 520 is removed from the molded package body 530 and turned upside down. Subsequently, the side of the molded package body 530 where the active surface 511 (or the interconnect pad 514) is located is drilled (e.g., laser drilled) to expose the interconnect pad 514. Thinning may be performed as desired prior to drilling.

Figure 5G:
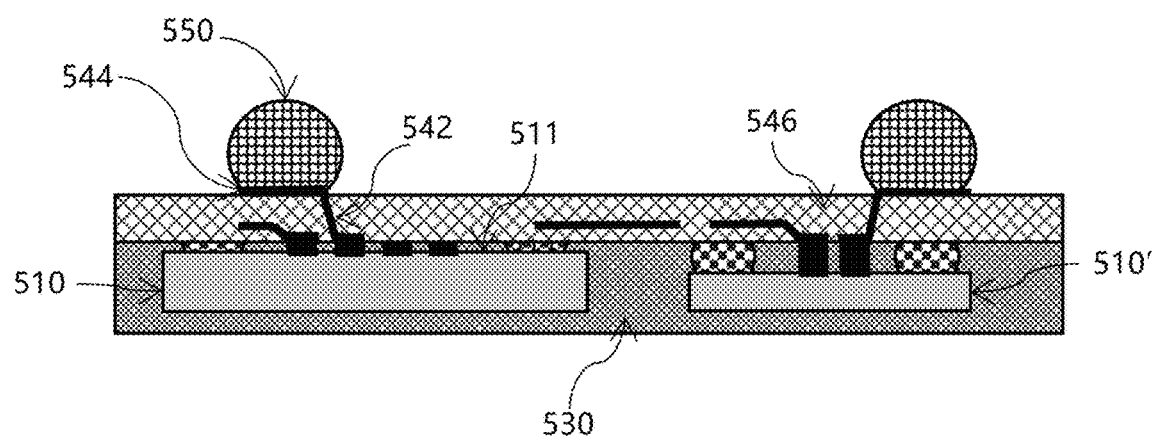

As shown in FIG. 5G, redistribution layer (RDL) traces 542, UBM 544, and solder balls 550 are sequentially formed on the surface of the molded package body 530 where the interconnect pads 514 are exposed to form conductive paths from the interconnect pads 514 to the corresponding solder balls 550. In this process, a dielectric layer 546 is also formed to electrically isolate the conductive paths, particularly when forming RDL traces 542 and/or UBMs 544.

Finally, although not shown, dicing may be performed according to the functional design specifications of the semiconductor device to complete the fabrication of individual semiconductor devices.

It is apparent that those skilled in the art can make various changes and modifications to the embodiments of the present application without departing from the spirit and scope of the application. Thus, to the extent that such modifications and variations fall within the scope of the claims and their equivalents, it is intended that the present disclosure encompass such modifications and variations as well.

What is claimed is:

1. A semiconductor packaging method, comprising:
providing at least one semiconductor device and a carrier board, wherein the at least one semiconductor device has an active side, a plurality of connecting terminals on the active side, and a plurality of first alignment solder parts formed on the active side, the carrier board has a plurality of second alignment solder parts respectively corresponding to the plurality of first alignment solder parts formed on a surface of the carrier board;
placing the at least one semiconductor device on the carrier board such that the plurality of first alignment solder parts are substantially aligned with respective ones of the plurality of second alignment solder parts;
forming a plurality of alignment solder joints by soldering the plurality of first alignment solder parts to respective ones of the plurality of second alignment solder parts whereby the at least one semiconductor device is aligned and fixed to the carrier board and a space is formed between each of the plurality of connecting terminals and the surface of the carrier board;
encapsulating the at least one semiconductor device using a molding compound to form a molded package body on a side of the carrier board where the at least one semiconductor device is disposed, the molded package body having a front side facing the carrier board and a back side facing away from the carrier board;

after removing the carrier board, removing a portion of the molding compound on the front side of the molded package body to expose the connecting terminals;

sequentially forming an interconnection layer and external terminals on the front side of the molded package body, whereby the connection terminals are electrically connected to the external terminals through the interconnection layer; and removing a portion of the molded package body from the back side of the molded package body after forming the interconnection layer and the external terminals.

2. A semiconductor packaging method according to claim 1, wherein one of a respective first alignment solder part and a corresponding second alignment solder part is a solder bump, and the other of the respective first alignment solder part and the corresponding second alignment solder part is a solder pad or a solder bump.

3. A semiconductor packaging method according to claim 2, wherein the first alignment solder parts and/or the second alignment solder parts are made of solder, and soldering the plurality of first alignment solder parts to respective ones of the plurality of second alignment solder parts includes melting the solder.

4. A semiconductor packaging method according to claim 3, wherein the plurality of first alignment-solder parts and/or the plurality of second alignment-solder parts are pre-coated with viscous flux such that the at least one semiconductor device is attached to the carrier board when the at least one semiconductor device is placed on the carrier board and the plurality of first alignment solder parts are substantially aligned with respective ones of the plurality of second alignment solder parts, the method further comprising, before soldering the plurality of first alignment solder parts to respective ones of the plurality of second alignment solder parts, turning the at least one semiconductor device and the carrier board over so that the carrier board is above the at least one semiconductor device, wherein the plurality of alignment solder joints are formed while the at least one semiconductor device is hanging off the carrier board by the plurality of alignment solder joints.

5. A semiconductor packaging method according to claim 3, further comprising, after forming the plurality of alignment solder joints, turning the at least one semiconductor device and the carrier board as a whole to enable the carrier board to be above the at least one semiconductor device, melting or partially melting the plurality of alignment solder joints, and cooling and solidifying the alignment solder joints after melting or partially melting the alignment solder joints while the at least one semiconductor device is hanging off the carrier board by the plurality of alignment solder joints.

6. A semiconductor packaging method according to claim 1, wherein the plurality of first alignment solder parts are located near edges of the at least one chip-semiconductor device where the connection terminals are absent.

7. A semiconductor packaging method of claim 1, wherein the at least one semiconductor device is placed on the surface of the carrier board such that the plurality of first alignment solder parts are in contact with respective ones of the plurality of second alignment solder parts but are not precisely aligned with respective ones of the plurality of second alignment solder parts.

8. A semiconductor packaging method according to claim 1, wherein each of the connection terminals is an interconnection bump formed on an interconnection pad, and a sum of heights of a respective first alignment solder part and a corresponding second alignment solder part in a direction perpendicular to the active surface is sufficiently large so that a height of a corresponding alignment solder joint formed thereof is larger in height than a height of the interconnection bump.

9. A semiconductor packaging method according to claim 8, wherein removing a portion of the molding compound to expose the connection terminals comprises: thinning the molded package body to expose the interconnection bumps.

10. A semiconductor packaging method according to claim 1, wherein the connection terminals are interconnection pads, and removing a portion of the molding compound to expose the connection terminals comprises: forming openings in the molded package body to expose the interconnect pads.

11. A semiconductor packaging method according to claim 1, further comprising: dicing the molded package body with the interconnection layer and the external terminals formed thereon.

12. A semiconductor packaging method according to claim 1, wherein the alignment solder joints are at least partially retained for at least one of electrical connection, heat dissipation and mechanical structure of a semiconductor component made by the semiconductor packaging method after the carrier board is removed.

13. A semiconductor packaging method according to claim 1, further comprising: removing at least part of the alignment solder joints when the carrier board is removed or after the carrier board is removed.

14. A semiconductor packaging method according to claim 1, wherein the interconnection layer comprises a re-distribution layer and an under-bump metallization layer.

15. A semiconductor component made by the semiconductor packaging method according to claim 1.

16. An electronic device comprising the semiconductor component of claim 15.

17. A semiconductor packaging method, comprising:
providing at least one semiconductor device and a carrier board, wherein the at least one semiconductor device has an active side, a plurality of connecting terminals on the active side, and a plurality of first alignment solder parts formed on the active side, the carrier board has a plurality of second alignment solder parts respectively corresponding to the plurality of first alignment solder parts formed on a surface of the carrier board;

placing the at least one semiconductor device on the surface of the carrier board such that the plurality of first alignment solder parts are substantially aligned with respective ones of the plurality of second alignment solder parts;

forming a plurality of alignment solder joints by soldering the plurality of first alignment solder parts to respective ones of the plurality of second alignment solder parts whereby the at least one semiconductor device is aligned and fixed to the carrier board;

encapsulating the at least one semiconductor device using a molding compound to form a molded package body on a side of the carrier board where the at least one semiconductor device is disposed;

after removing the carrier board, removing a portion of the molding compound from the molded package body to expose the connecting terminals; and sequentially forming an interconnection layer and external terminals on the molded package body whereby the connection terminals are electrically connected to the external terminals through the interconnection layer;

wherein one of a respective first alignment solder part and a corresponding second alignment solder part is a solder bump made of solder, and the other of the respective first alignment solder part and the corresponding second alignment solder part is a solder pad or a solder bump made of solder;
wherein soldering the plurality of first alignment solder parts to respective ones of the plurality of second alignment solder parts includes melting the solder;
wherein the at least one semiconductor device includes a plurality of semiconductor devices each having an active surface and an opposing passive surface, wherein the active surfaces of the plurality of semiconductor devices face the surface of the carrier board, and wherein forming the plurality of alignment solder joints comprises, when the plurality of semiconductor devices are aligned with the carrier board and the plurality of alignment solder joints are in a molten or partially molten state, flattening passive surfaces of the plurality of semiconductor devices using a flattening plate until the alignment solder joints are basically solidified so that the passive surfaces of the plurality of semiconductor devices are positioned in a same plane parallel to the carrier board, and removing the flattening plate.

18. A semiconductor package method according to claim 17, wherein one or more solder traps are pre-formed around each of the plurality of second alignment solder parts on the carrier board to prevent overflow of excess molten solder during flattening.

19. A semiconductor packaging method according to claim 17, further comprising: thinning the molded package body by removing a portion of the molded package body from the back side of the molded package body after forming the interconnection layer and the external terminals.

20. A semiconductor packaging method, comprising:
providing at least one semiconductor device and a carrier board, wherein the at least one semiconductor device has an active side, a plurality of connecting terminals on the active side, and a plurality of first alignment solder parts formed on the active side, the carrier board has a plurality of second alignment solder parts respectively corresponding to the plurality of first alignment solder parts formed on a surface of the carrier board;
placing the at least one semiconductor device on the surface of the carrier board such that the plurality of first alignment solder parts are substantially aligned with respective ones of the plurality of second alignment solder parts;
forming a plurality of alignment solder joints by soldering the plurality of first alignment solder parts to respective ones of the plurality of second alignment solder parts whereby the at least one semiconductor device is aligned and fixed to the carrier board;
encapsulating the at least one semiconductor device using a molding compound to form a molded package body on a side of the carrier board where the at least one semiconductor device is disposed;
after removing the carrier board, removing a portion of the molding compound from the molded package body to expose the connecting terminals; and
sequentially forming an interconnection layer and external terminals on the molded package body whereby the connection terminals are electrically connected to the external terminals through the interconnection layer;
wherein one of a respective first alignment solder part and a corresponding second alignment solder part is a solder bump made of solder, and the other of the respective first alignment solder part and the corresponding second alignment solder part is a solder pad or a solder bump made of solder;
wherein soldering the plurality of first alignment solder parts to respective ones of the plurality of second alignment solder parts includes melting the solder;
wherein the at least one semiconductor device includes a plurality of semiconductor devices each having an active surface and an opposing passive surface, wherein the active surfaces of the plurality of semiconductor devices face the surface of the carrier board, and wherein the semiconductor packaging method further comprises, after forming the plurality of alignment solder joints, melting or partially melting the alignment solder joints, flattening the passive surfaces of the plurality of semiconductor devices by using a flattening plate until the alignment solder joints are solidified so that the passive surfaces of the plurality of semiconductor devices are positioned in a same plane parallel to the carrier board, and removing the flattening plate.

* * * * *